(12) United States Patent
Kumar et al.

(10) Patent No.: US 7,452,488 B2
(45) Date of Patent: Nov. 18, 2008

(54) TIN OXIDE-BASED SPUTTERING TARGET, LOW RESISTIVITY, TRANSPARENT CONDUCTIVE FILM, METHOD FOR PRODUCING SUCH FILM AND COMPOSITION FOR USE THEREIN

(75) Inventors: Prabhat Kumar, Framingham, MA (US); Rong-Chein Richard Wu, Chelmsford, MA (US); Shuwei Sun, Framingham, MA (US)

(73) Assignee: H.C. Starck Inc. (DE)

( * ) Notice: Subject to any disclaimer, the term of this patent is extended or adjusted under 35 U.S.C. 154(b) by 0 days.

(21) Appl. No.: 11/590,179

(22) Filed: Oct. 31, 2006

(65) Prior Publication Data

US 2008/0099731 A1    May 1, 2008

(51) Int. Cl.
*H01B 1/00* (2006.01)
*H01B 1/12* (2006.01)

(52) U.S. Cl. ............. 252/500; 204/192.22; 204/192.26; 423/54; 428/142; 428/432; 428/655

(58) Field of Classification Search .................. 428/432, 428/142, 655; 324/54; 204/192.22, 192.26; 252/500; 423/54
See application file for complete search history.

(56) References Cited

U.S. PATENT DOCUMENTS

| | | | |
|---|---|---|---|
| 4,707,346 A | 11/1987 | Hormadaly | 423/518 |
| 6,193,856 B1 * | 2/2001 | Kida et al. | 204/192.22 |
| 6,534,183 B1 | 3/2003 | Inoue | 428/432 |
| 6,586,101 B2 | 7/2003 | Chu | 428/432 |
| 6,689,477 B2 * | 2/2004 | Inoue | 428/432 |
| 6,818,924 B2 | 11/2004 | Kim et al. | 257/79 |
| 6,911,163 B2 | 6/2005 | Abe | 252/521.3 |
| 6,979,435 B1 | 12/2005 | Shahriari et al. | 423/593.1 |
| 2004/0013899 A1 * | 1/2004 | Abe | 428/655 |
| 2005/0082162 A1 * | 4/2005 | Uno et al. | 204/192.26 |
| 2005/0239660 A1 | 10/2005 | Abe et al. | 505/475 |
| 2006/0046026 A1 * | 3/2006 | Fujisawa et al. | 428/142 |
| 2006/0099140 A1 | 5/2006 | Abe | 423/594.13 |
| 2006/0165572 A1 * | 7/2006 | McHugh et al. | 423/54 |
| 2007/0071985 A1 * | 3/2007 | Kumar et al. | 428/432 |

FOREIGN PATENT DOCUMENTS

| | | | |
|---|---|---|---|
| JP | 58-054338 | * | 3/1983 |
| JP | 61256506 | | 11/1986 |
| JP | 2000-077358 | * | 3/2000 |
| JP | 2000-234167 | * | 8/2000 |
| JP | 2000 273622 | | 10/2000 |
| JP | 2000-273622 | * | 10/2000 |
| JP | 2000 281431 | | 10/2000 |
| JP | 2000-281431 | * | 10/2000 |
| JP | 2002-275624 | * | 9/2002 |
| JP | 2003-226966 | * | 8/2003 |
| WO | WO 2005-040044 | * | 5/2005 |
| WO | WO 2005-078152 A1 | * | 8/2005 |
| WO | WO 2005-086180 | * | 9/2005 |
| WO | WO-2007/041081 | | 4/2007 |
| WO | WO-2007/055231 | | 5/2007 |
| WO | WO-2007/142043 | | 12/2007 |
| WO | WO-2007/142330 | | 12/2007 |

OTHER PUBLICATIONS

Nitta M., Kanefuas S., and Hardroma M.; Propane Gas Detector Using SnO2 doped with NB, V, Ti, or Mo; 1978; J. Electrochem. Soc.; vol. 125 pp. 1676-1679.*

G. Hass et al., Transparent Conducting Films, 1977, vol. 9, pp. 1-71.*

Journal of Materials Science, vol. 40, month unavailable 2005, pp. 1611-1614, Y Abe et al, "Amorphous indium tungsten oxide films prepared by DC magnetron sputtering".

MRS Bulletin, Aug. 2000, pp. 45-51, A.J. Freeman et al, "Chemical and Thin-Film Strategies for New Transparent Conducting Oxides".

Coating Materials News, vol. 15, Issue 1, Mar. 2005, p. 1 and 3, "Transparent Conductive Oxides: ITO Replacements".

Journal of Electroceramics, vol. 13, month unavailable 2004, pp. 167-175, B.J. Ingram et al, "Chemical and Structural Factors Governing Transparent Conductivity in Oxides".

(Continued)

*Primary Examiner*—Mark Kopec
*Assistant Examiner*—Khanh Tuan Nguyen
(74) *Attorney, Agent, or Firm*—Connolly Bove Lodge & Hutz LLP

(57) ABSTRACT

The present invention is directed to a composition consisting essentially of:
  a) from about 60 to about 99 mole % of $SnO_2$, and
  b) from about 1 to about 40 mole % of one or more materials selected from the group consisting of
    i) $Nb_2O_5$,
    ii) NbO,
    iii) $NbO_2$,
    iv) $WO_2$,
    v) a material selected consisting of a) a mixture of $MoO_2$ and Mo and b) Mo,
    vi) W,
    vii) $Ta_2O_5$, and
    viii) mixtures thereof,
wherein the mole % s are based on the total product and wherein the sum of components a) and b) is 100. The invention is also directed to the sintered product of such composition, a sputtering target made from the sintered product and a transparent electroconductive film made from the composition.

9 Claims, No Drawings

OTHER PUBLICATIONS

Semiconductor Science and Technology, vol. 20, month unavailable 2004, pp. S35-S44, "Transparent conducting oxide semiconductors for transparent electrodes".

Applied Physics Letters, vol. 87, month unavailable 2005, pp. 112108-1-112108-3, P.F. Newhouse et al, "High electron mobility W-doped $In_2O_3$ thin films by pulsed laser deposition".

Journal of the Korean Physical Society, vol. 44, No. 4, Apr. 2004, pp. 956-961, Honglyoul Ju et al, "Electrical and Optical Properties of New Transparent Conducting Oxide $In_2O_3$:Ta Thin Films".

J. Phys. D: Appl. Phys. 23, month unavailable 1990, pp. 1212-1215, V. Casey et al, "A study of undoped and molybdenum doped, polycrystalline, tin oxide thin films produced by a simple reactive evaporation technique".

* cited by examiner

TIN OXIDE-BASED SPUTTERING TARGET, LOW RESISTIVITY, TRANSPARENT CONDUCTIVE FILM, METHOD FOR PRODUCING SUCH FILM AND COMPOSITION FOR USE THEREIN

BACKGROUND OF THE INVENTION

U.S. Pat. No. 4,707,346 describes doping an $SnO$—$SnO_2$ system $Ta_2O_5$ and/or $Nb_2O_5$ using pyrochlore-related compounds for use in thick film resistor compositions.

U.S. Pat. No. 6,534,183 describes compositions useful to prepare transparent electroconductive films. Most of the compositions described therein require the presence of indium oxide. In the broad compositions described (see column 5, lines 13-22 and column 6, lines 2-68), the reference suggests that zinc oxide and relatively small amounts of one or more oxides selected from the group consisting of iridium oxide, rhenium oxide, palladium oxide, vanadium, molybdenum and ruthenium also be added. The reference does not define the phrase "molybdenum oxide." As is known in the art, molybdenum oxide can have valencies of 2, 3, 4, 5 and 6. In general, where the art refers to "molybdenum oxide", the oxide "molybdenum trioxide ($MoO_3$)" is meant.

$SnO_2$, $ZnO_2$, $In_2O_3$, and ITO are known to be useful as transparent conductive coatings (see, e.g., U.S. Pat. Nos. 6,586,101, 6,818,924 and 6,979,435; "Amorphous indium tungsten oxide films prepared by DC magnetron sputtering," Abe et al, Journal of Materials Science, volume 40, 2005, pages 1611 through 1614; "Chemical and Thin-Film Strategies for New Transparent Conducting Oxides," Freeman et al, MRS Bulletin, August 2000, pages 45 through 51; "Transparent Conductive Oxides: ITO Replacements," Coating Materials News, volume 15, Issue 1, March 2005, pages 1 and 3; "Chemical and Structural Factors Governing Transparent Conductivity in Oxides," Ingram et al, Journal of Electroceramics, volume 13, 2004, pages 167-175; and "Transparent conducting oxide semiconductors for transparent electrodes," Minami, Semiconductor Science and Technology, volume 20, 2004, pages S35-S44). Transparent conductive films from tungsten or germanium-doped for indium oxide (see U.S. Pat. No. 6,911,163) and from indium oxide doped with ZnO and/or $WO_3$ (see US Patent application publications 2005/0239660 and 2006/0099140, "High electron mobility W-doped $In_2O_3$ thin films by pulsed laser deposition," Newhouse et al, Applied Physics Letters, Volume 87, 2005, pages 112108-1 through 12108-3) are also known. Finally, transparent conducting oxides of $In_2O_3$ doped with $Ta_2O_5$ are also known (see "Electrical and Optical Properties of New Transparent Conducting Oxide $In_2O_3$:Ta Thin Films," Ju et al, Journal of Korean Physical Society, volume 44, no. 4, 2004, pages 956-961). Finally, Casey et al ("A study of undoped and molybdenum doped, polycrystalline, tin oxide thin films produced by a simple reactive evaporation technique," J. Phys. D: Appl. Phys., volume 23, pages 1212-1215) describe a technique wherein doping is achieved by placing a molybdenum foil in front of a tin substrate during thin film deposition. The resultant material is apparently a molybdenum oxide-doped tin oxide (see the 5th paragraph in the right column of page 1213).

In order to be commercially useful in flat panel displays as transparent conducting oxide, the film must have an electrical conductivity of at least $10^3$ S/cm and a light transmittance of at least 80%.

For a material or film to be considered as conductor, the resistivity should be less than $10^{-2}$ ohm-cm. For a material or film to be considered as a semiconductor, the resistivity should be between 1 and $10^8$ ohm-cm. A material having a resistivity of 1 ohm-cm is considered as something between a conductor and a semiconductor.

Depending on the processing conditions, the film can be either a conductor or a semiconductor. If the film has semiconductor properties, it then can be used as semiconductor layer in transparent electronics applications (e.g., transparent thin-film transistor).

DESCRIPTION OF THE INVENTION

The present invention is directed to a composition that can be used to produce a transparent conductive film, the sintered product of such composition, a sputtering target made from the sintered product and a transparent electroconductive film made from the composition.

More particularly, the present invention is directed to a composition consisting essentially of:
a) from about 60 to about 99 mole % of $SnO_2$, and
b) from about 1 to about 40 mole % of one or more materials selected from the group consisting of
  i) $Nb_2O_5$,
  ii) NbO,
  iii) $NbO_2$,
  iv) $WO_2$,
  v) a material selected consisting of a) a mixture of $MoO_2$ and Mo and b) Mo,
  vii) W,
  vii) $Ta_2O_5$, and
  viii) mixtures thereof, wherein the mole % s are based on the total product and wherein the sum of components a) and b) is 100. The invention is also directed to the sintered product of such composition, a sputtering target made from the sintered product and a transparent electroconductive film made from the composition.

Preferred ranges are a) from about 90 to about 99 mole % of $SnO_2$ and b) from about 1 to about 10 mole % of the component b)i) through b)viii). In addition, when a mixture of $MoO_2$ and Mo is used (component b)v)), a preferred ratio of moles of $MoO_2$ to moles of Mo is from about 100:1 to 1:100, and preferably from 10:1 to 1:10.

The films produced from these compositions are characterized by light transmittances (i.e., transparencies) of 80% or more, and in some instances by electrical conductivities of more than 103 S/cm.

The powders are either used in the as received state after applying a rough sieving (to <150 μm) or they are uniformly ground and mixed in a suitable mixing and grinding machine (e.g., in a dry ball or wet ball or bead mill or ultrasonically). In case of wet processing, the slurry is dried and the dried cake broken up by sieving. Dry processed powders and mixtures are also sieved. The dry powders and mixtures are granulated.

Concerning shaping into bodies of the desired shape, there are several processes that can be used.

First, a cold compaction process can be used. The shaping can be performed using substantially any appropriate process. Known processes for cold compaction are cold axial pressing and cold isostatic pressing ("CIP"). In cold axial pressing, the granulated mixture is placed in a mold and pressed to form a compact product. In cold isostatic pressing, the granulated mixture is filled into a flexible mold, sealed and compacted by means of a medium pressure being applied to the material from all directions.

Thermal consolidation without or with the application of mechanical or gas pressure can also be used and is preferably used for further densification and strengthening. The thermal consolidation can be performed using substantially any appropriate process. Known processes include sintering in vacuum, in air, in inert or reactive atmosphere, at atmospheric pressure or at increased gas pressure, hot pressing and hot isostatic pressing ("HIP").

Sintering is performed by placing the shaped material into an appropriate furnace and running a specified temperature-time gas-pressure cycle.

In the hot pressing process, the granulated mixture is placed in a mold and is sintered (or baked) with simultaneous mechanical pressing.

In the HIP process, there are at least two possibilities. In the first one, called sinter-HIP, the shaped material is placed into the HIP-furnace and a temperature-time cycle at low gas-pressure is primarily run until the stage of closed pores is reached, corresponding with about 93-95% of the theoretical density. Then the gas-pressure is increased, acting as a densification means to eliminate residual pores in the body.

In the second case, the so-called clad-HIP, the granulated mixture is placed in a closed mold made of refractory metal, evacuated and sealed. This mold is placed into the HIP-furnace and an appropriate temperature-time gas-pressure cycle is run. Within this cycle, the pressurized gas performs an isostatic pressing (i.e., pressure is applied to the mold and by the mold to the material inside from all directions).

The raw material oxides are preferably ground as fine as possible (e.g., mean particle size no larger than 5 µm, preferably no larger than 1 µm). The shaped bodies are generally sintered (or baked) at a temperature of from about 500 to about 1600° C. for a period of time of from about 5 minutes to about 8 hours, with or without the application of mechanical or gas pressure to assist in densification.

Substantially any shape and dimension of sintered product can be produced. For example, the product can be square, rectangular, circular, oval or tubular. If desired, the shape can be the same as the desired sputtering target. Regardless of the shape of the sintered product, it is then machined into a size and shape which will fit to an appropriate sputtering unit. As is known in the art, the shape and dimensions of the sputtering target can be varied depending on the ultimate use. For example, the sputtering targets may be square, rectangular, circular, oval or tubular. For large size targets, it may be desirable to use several smaller sized parts, tiles or segments which are bonded together to form the target. The targets so produced may be sputtered to form films on a wide variety of transparent substrates such as glass and polymer films and sheets. In fact, one advantage of the present invention is that transparent, electroconductive films can be produced from the compositions of the present invention by depositing at room temperature and the resultant film will have excellent conductivity and transparency.

In one embodiment, a plate made in accordance with the invention is made into a sputtering target. The sputtering target is made by subjecting the plate to machining until a sputtering target having desired dimensions is obtained. The machining of the plate can be any machining suitable for making sputtering targets having suitable dimensions. Examples of suitable machining steps include but are not limited to laser cutting, water jet cutting, milling, turning and lathe-techniques. The sputtering target may be polished to reduce its surface roughness. The dimensions and shapes of the plates can vary over a wide range.

Any suitable method of sputtering may be used in the invention. Suitable methods are those that are able to deposit a thin film on a plate (or substrate). Examples of suitable sputtering methods include, but are not limited to, magnetron sputtering, magnetically enhanced sputtering, pulse laser sputtering, ion beam sputtering, triode sputtering, radio frequency (RF) and direct current (DC) diode sputtering and combinations thereof. Although sputtering is preferred, other methods can be used to deposit thin films on the substrate plate. Thus, any suitable method of depositing a thin film in accordance with the invention may be used. Suitable methods of applying a thin film to a substrate include, but are not limited to, electron beam evaporation and physical means such as physical vapor deposition.

The thin film applied by the present method can have any desired thickness. The film thickness can be at least 0.5 nm, in some situations 1 nm, in some cases at least 5 nm, in other cases at least 10 nm, in some situations at least 25 nm, in other situations at least 50 nm, in some circumstance at least 75 nm, and in other circumstances at least 100 nm. Also, the film thickness can be up to 10 µm, in some cases up to 5 µm, in other cases up to 2 µm, in some situations up to 1 µm, and in other situations up to 0.5 µm. The film thickness can be any of the stated values or can range between any of the values stated above.

The thin films can be used in flat panel displays (including television screens and computer monitors), touch screen panels (such as are used, e.g., in cash registers, ATMs and PDAs), organic light-emitting diodes (such as are used, e.g., in automotive display panels, cell phones, games and small commercial screens), static dissipaters, electromagnetic interference shielding, solar cells, electrochromic mirrors, LEDs, sensors, transparent electronics, other electronic and semiconductor devices and architectural heat reflective, low emissivity coatings.

Transparent electronics is an emerging field for potential applications such as imaging and printing. Compared to organic or polymer transistor materials, the inorganic oxide of the present invention have higher mobility, better chemical stability, ease of manufacture and are physically more robust.

The invention will now be described in more detail with reference to the examples which follow. In the examples, the following powders were used:

i) $SnO_2$—13123JOPO, high purity powder, commercially available from Sigma-Aldrich, having a purity >99.9% and a mean particle diameter of <10 µm ii) $Nb_2O_5$—Grade HPO 400, a commercial high purity product of H. C. Starck, having a purity >99.9% and a mean particle diameter of <25 µm iii) NbO—Grade HCST CG 80K, a commercial product of H. C. Starck having a purity >99.9% and a mean particle diameter of <25 µm iv) $WO_2$, an HCST-internal intermediate product in the production of W-powder, having a purity of >99% and a mean particle diameter of <20 µm v) $MoO_2$—MMP3230, a commercial product from H. C. Starck, having a purity of >99.9% and a mean particle diameter of <10 µm vi) Mo—OMPF—250 mesh (passing through a 63 µm mesh sieve), a commercial product from H. C. Starck, having a purity of 99.95% vii) $Ta_2O_5$—Grade HPO 600, a commercial product of H. C. Starck, having a purity of >99.9% and a mean particle diameter of <2 µm viii) $NbO_2$—XAF 1105253, an H. C. Starck internal intermediate product in the production of Nb powder, having a purity of >99.5% and a mean particle diameter of <20 µm ix) W (tungsten powder)—Grade WMP HC70S, a commercial product of H. C. Starck, having a purity of 99.95%, a maximum oxygen content of <0.5%, a Fisher size of 0.7 μm and an apparent density of from 35 to 45 g/in³

General Procedure Used in the Examples:

For the examples two different ways to prepare the powder mixtures were used:

i) Dry mixing: The powders in the weight ratios noted were poured into a PVA plastic bottle, together with the same total weight amount of $Al_2O_3$ balls of 8-10 mm diameter. The mixture was comminuted by rotating the bottle at a rate of 60 times per minute for 12 hours. This comminuted material was emptied on a sieve of 500 μm opening size and the balls removed. In a second step, the powder was passed through a sieve with size 150 μm.

ii) Wet mixing: The powders in the weight ratios noted were poured into a PVA plastic bottle, together with twice the amount of $Al_2O_3$ balls of about 3 mm diameter and two and a half times the weight of 2-propanol. The bottle was shaken on a shaker mixer for 5 hours. The material was emptied on a sieve of 500 μm opening size and the balls were removed. The material was dried on a rotating vacuum evaporator and the dried cake broken by passing it through a sieve with size 150 μm.

Assuming a complete densification to the theoretical density, the amounts of powders based on the desired compositions and respective densities of the powders, were calculated to make samples with a diameter of 100 mm and a thickness of 8 mm. This powder mass was filled into a graphite hot-pressing mold of 100 mm diameter which was isolated against the powder by a graphite foil. The filled mold was placed in a vacuum tight hot-press, the vessel evacuated and heated up to 300° C. to remove enclosed air and humidity and then refilled with argon. A pressure of 25 MPa was then applied and the temperature increased by 5 K/minute. By use of the displacement measuring device of the hot press, densification could be recorded. Heating-up was stopped when the displacement rate approached zero, followed by a 15 minute holding time at this maximum temperature. Then, the temperature was reduced in a controlled manner of 10 K/minute to 600° C., simultaneously the pressure was reduced. Then, the furnace was shut-off to cool down completely. The temperature where densification ceased was noted. After removing the consolidated sample from the cold mold, the part was cleaned and the density determined.

For film deposition experiments, the sample was ground on its flat sides to remove contaminations and machined by water-jet cutting to a 3" disc. From cut-offs of the samples, electrical conductivity of the bulk material was measured using the known four-wire method. Deposition was performed on a glass substrate using a PLD-5000 system commercially available from PVD Products at the temperature noted and under the conditions noted. The thickness of the deposited film was about 100 nm. Nano Pulse Laser Deposition system built by PVD Products (Wilmington, Mass.) was used for thin film deposition.

Light transmittance was measured using a Cary 50 Scan Spectrophotometer having a spectrum range of form 190 to 100 nm (with resolution of 1.5 nm), available form Varian. The unit has capacity to measure absorption, % transmission and % reflectivity. The transmittance numbers reported represent the average of light transmittance from 400 to 750 nm.

The resistivity was measured by Model 280 SI Sheet Measurement System made by Four Dimensions (Hayward, Calif.). The resistivity tester had a range of $10^{-3}$ to $8 \times 10^5$ ohm/square for sheet resistance with 2" to 8" diameter platen. The system also has the capability of resistivity contour mapping of the thin film surface. The device measures "sheet resistance." Sheet resistance is converted to resistivity according to the following formula:

Resistivity=sheet resistance×thickness (in cm)

EXAMPLE 1

95 Mole % $SnO_2$-5 Mole % $WO_2$ $SnO_2$-powder and $WO_2$-powder were mixed in the above-noted ratio by the Wet Method and hot-pressed as described.

The temperature where densification ceased was 810° C.

The calculated theoretical density of this composition was 7.3 g/cm³ and the measured density of the hot-pressed plate was 6.5 g/cm³.

Electrical conductivity of the target was 0.63 S/cm.

Thin Film Deposition:

Conditions of deposition on a glass substrate: The thin films were deposited with a 250 mJ laser pulse at 50 Hz with an oxygen pressure of 10 mTorr and for a period of 31 seconds.

Resistivity/room temperature deposition: $1.69 \times 10^{-1}$ Ω-cm

Transmittance/room temperature deposition: 80.4%

Resistivity/200° C.: $5.35 \times 10^{-3}$ Ω-cm

Transmittance/200° C.: 85.3%

EXAMPLE 2

95 Mole % $SnO_2$-5 Mole % $Nb_2O_5$ $SnO_2$-powder and $Nb_2O_5$-powder were mixed in the above-noted ratio by the Wet Method and hot-pressed as described.

The temperature where densification ceased was 880° C.

The calculated theoretical density of this composition was 6.74 g/cm³ and the measured density of the hot-pressed plate was 6.34 g/cm³.

Electrical conductivity of the target was $2.86 \times 10^{-6}$ S/cm

Thin Film Deposition:

Conditions of deposition on a glass substrate: The thin films were deposited with a 250 mJ laser pulse at 50 Hz with an oxygen pressure of 10 mTorr and for a period of 39 seconds.

Resistivity/room temperature deposition: 6.27 Ω-cm

Transmittance/room temperature deposition: 80.9%

Resistivity/200° C.: $1.2 \times 10^{-1}$ Ω-cm

Transmittance/200° C.: 83.8%

EXAMPLE 3

60 Mole % $SnO_2$-40 Mole % NbO $SnO_2$-powder and NbO-powder were mixed in the above-noted ratio by the Wet Method and hot-pressed as described.

The temperature where densification ceased was <100000.

The calculated theoretical density of this composition was 7.06 g/cm³ and the measured density of the hot-pressed plate was 5.64 g/cm³.

Electrical conductivity of the target was >1.28×10$^{-7}$ S/cm

Thin Film Deposition:

Conditions of deposition on a glass substrate: The thin films were deposited with a 250 mJ laser pulse at 50 Hz with an oxygen pressure of 10 mTorr and for a period of 49 seconds.

Resistivity/room temperature deposition: semiconducting

Transmittance/room temperature deposition: 84.8%

Resistivity/200° C.: semiconducting

Transmittance/200° C.: 86%

EXAMPLE 4

95 Mole % SnO$_2$-5 Mole % NbO

SnO$_2$-powder and NbO-powder were mixed in the above-noted ratio by the Wet Method and hot-pressed as described.

The temperature where densification ceased was <1000° C.

The calculated theoretical density of this composition was 6.96 g/cm$^3$ and the measured density of the hot-pressed plate was 6.18 g/cm$^3$.

Electrical conductivity of the target was 0.18 S/.cm.

Thin Film Deposition:

Conditions of deposition on a glass substrate: The thin films were deposited with a 250 mJ laser pulse at 50 Hz with an oxygen pressure of 10 mTorr and for a period of 30 seconds.

Resistivity/room temperature deposition: 1.36×10$^{-1}$ Ω-cm

Transmittance/room temperature deposition: 79.8%

Resistivity/200° C.: 1.67×10$^{-3}$°-cm

Transmittance/200° C.: 82.0%

EXAMPLE 5

94.75 Mole % SnO$_2$-5 Mole % MoO$_2$-0.25 Mole % Mo

SnO$_2$-powder, MoO$_2$-powder and Mo-powder were mixed in the above-noted ratio by the Wet Method and hot-pressed as described.

The temperature where densification ceased was <1000° C.

The calculated theoretical density of this composition was 6.93 g/cm$^3$ and the measured density of the hot-pressed plate was 6.49 g/cm$^3$.

Electrical conductivity of the target was 0.07 S/cm.

Thin Film Deposition:

Conditions of deposition on a glass substrate: The thin films were deposited with a 250 mJ laser pulse at 50 Hz with an oxygen pressure of 10 mTorr and for a period of 31 seconds.

Resistivity/room temperature deposition: 1.71×10$^{-1}$ Ω-cm

Transmittance/room temperature deposition: 76.0%

Resistivity/200° C.: 6.25×10$^{-3}$ Ω-cm

Transmittance/200° C.: 81.7%

EXAMPLE 6

97.5% SnO$_2$-2.5 Mole % Mo

SnO$_2$-powder and Mo-powder were mixed in the above-noted ratio by the Wet Method and hot-pressed as described.

The temperature where densification ceased was 980° C.

The calculated theoretical density of this composition was 6.93 g/cm$^3$ and the measured density of the hot-pressed plate was 6.24 g/cm$^3$.

Electrical conductivity of the target was 0.10 S/cm.

Thin Film Deposition:

Conditions of deposition on a glass substrate: The thin films were deposited with a 250 mJ laser pulse at 50 Hz with an oxygen pressure of 10 mTorr and for a period of 30 seconds.

Resistivity/room temperature deposition: 2.22×10$^{-1}$ Ω-cm

Transmittance/room temperature deposition: 78.6%

Resistivity/200° C.: 2.66×10$^{-2}$ Ω-cm

Transmittance/200° C.: 82.4%

EXAMPLE 7

95 Mole % SnO$_2$-5 Mole % Ta$_2$O$_5$

SnO$_2$-powder and Ta$_2$O$_5$-powder were mixed in the above-noted ratio by the Wet Method and hot-pressed as described.

The temperature where densification ceased was 1000° C.

The calculated theoretical density of this composition was 7.12 g/cm$^3$ and the measured density of the hot-pressed plate was 5.37 g/cm$^3$.

Electrical conductivity of the target was 0.01 S/cm.

Thin Film Deposition:

Conditions of deposition on a glass substrate: The thin films were deposited with a 250 mJ laser pulse at 50 Hz with an oxygen pressure of 10 mTorr and for a period of 35 seconds.

Resistivity/room temperature deposition: not tested

Transmittance/room temperature deposition: 81.4%

Resistivity/200° C.: 9.88×10$^{-3}$ Ω-cm

Transmittance/200° C.: 85.4%

Resistivity/300° C.: 6.1×10$^{-3}$ Ω-cm

EXAMPLE 8

95 Mole % SnO$_2$-5 Mole % NbO$_2$

SnO$_2$-powder and NbO$_2$-powder were mixed in the above-noted ratio by the Wet Method and hot-pressed as described.

The temperature where densification ceased was 880° C.

The calculated theoretical density of this composition was 6.91 g/cm$^3$ and the measured density of the hot-pressed plate was 5.81 g/cm$^3$.

Electrical conductivity of the target was 1.8×10$^{-5}$ S/cm.

Thin Film Deposition:

Conditions of deposition on a glass substrate: The thin films were deposited with a 250 mJ laser pulse at 50 Hz with an oxygen pressure of 10 mTorr and for a period of 30 seconds.

Resistivity/room temperature deposition: $4.00\times10^{-1}$ Ω-cm

Transmittance/room temperature deposition: 79%

Resistivity/200° C.: $2.28\times10^{-2}$ Ω-cm

Transmittance/200° C.: 81.5%

EXAMPLE 9

94.5 Mole % $SnO_2$-5 Mole % $MoO_2$-0.5 Mole % Mo $SnO_2$-powder, $MoO_2$-powder and Mo-powder were mixed in the above-noted ratio by the Wet Method and hot-pressed as described.

The temperature where densification ceased was 980° C.

The calculated theoretical density of this composition was 6.93 g/cm³ and the measured density of the hot-pressed plate was 6.24 g/cm³.

Electrical conductivity of the target was 0.02 S/cm.

Thin Film Deposition:

Conditions of deposition on a glass substrate: The thin films were deposited with a 250 mJ laser pulse at 50 Hz with an oxygen pressure of 10 mTorr and for a period of 31 seconds.

Resistivity/room temperature deposition: $1.9\times10^{-1}$ Ω-cm

Transmittance/room temperature deposition: 77.2%

Resistivity/20° C.: $2.41\times10^{-3}$ Ω-cm

Transmittance/200° C.: 82.2%

EXAMPLE 10

94.25 Mole % $SnO_2$-5 Mole % $MoO_2$-0.75 Mole % Mo $SnO_2$-powder, $MoO_2$-powder and Mo powder were mixed in the above-noted ratio by the Wet Method and hot-pressed as described.

The temperature where densification ceased was 980° C.

The calculated theoretical density of this composition was 6.93 g/cm³ and the measured density of the hot-pressed plate was 6.15 g/cm³.

Electrical conductivity of the target was 0.06 S/cm.

Thin Film Deposition:

Conditions of deposition on a glass substrate: The thin films were deposited with a 250 mJ laser pulse at 50 Hz with an oxygen pressure of 10 mTorr and for a period of 31 seconds.

Resistivity/room temperature deposition: $4.21\times10$ Ω-cm

Transmittance/room temperature deposition: 77.4%

Resistivity/200° C.: $1.58\times10^{-1}$ Ω-cm

Transmittance/200° C.: 80.7%

EXAMPLE 11

95% $SnO_2$-5 Mole % Mo $SnO_2$-powder and Mo-powder were mixed in the above-noted ratio by the Wet Method and hot-pressed as described.

The temperature where densification ceased was 980° C.

The calculated theoretical density of this composition was 6.99 g/cm³ and the measured density of the hot-pressed plate was 5.77 g/cm³.

Electrical conductivity of the target was 0.05 S/cm.

Thin Film Deposition:

Conditions of deposition on a glass substrate: The thin films were deposited with a 250 mJ laser pulse at 50 Hz with an oxygen pressure of 10 mTorr and for a period of 29 seconds.

Resistivity/room temperature deposition: $2.74\times10^{-1}$ Ω-cm

Transmittance/room temperature deposition: 78.5%

Resistivity/200° C.: $3.1\times10^{-2}$ Ω-cm

Transmittance/200° C.: 81.3%

EXAMPLE 12

95% $SnO_2$-5 Mole % W $SnO_2$-powder and W—powder were mixed in the above-noted ratio Wet Method and hot-pressed as described.

The temperature where densification ceased was 800° C.

The calculated theoretical density of this composition was 7.7 g/cm³ and the measured density of the hot-pressed plate was 6.69 g/cm³.

Electrical conductivity of the target: $9.35\times10^{-3}$ S/cm.

Thin Film Deposition:

Conditions of deposition on glass substrate: The thin films were deposited with a 250 mJ laser pulse at 50 Hz with an oxygen pressure of 10 mTorr and for a period of 33 seconds.

Resistivity/room temperature deposition: $4.35\times10^{-1}$ Ω-cm

Transmittance/room temperature deposition: 76.6%

Resistivity/200° C.: $1.65\times10^{-2}$ Ω-cm

Transmittance/200° C.: 81.1%

Resistivity/300° C.: $9.6\times10^{-3}$ Ω-cm

Transmittance/200° C.: 83.2%

EXAMPLE 13

97.5% $SnO_2$-2.5 Mole % Mo $SnO_2$-powder and Mo-powder were mixed in the above-noted ratio by the Dry Method and hot-pressed as described.

The temperature where densification ceased was 980° C.

The calculated theoretical density of this composition was 6.94 g/cm³ and the measured density of the hot-pressed plate was 5.58 g/cm³.

Electrical conductivity of the target: 0.03 S/cm.

Thin Film Deposition:

Conditions of deposition on glass substrate: The thin films were deposited with a 250 mJ laser pulse at 50 Hz with an oxygen pressure of 10 mTorr and for a period of 29 seconds.

Resistivity/room temperature deposition: $3.88 \times 10^{-1}$ Ω-cm

Transmittance/room temperature deposition: 78.8%

Resistivity/200° C.: $2.46 \times 10^{-2}$ Ω-cm

Transmittance/200° C.: 82.1%

EXAMPLE 14

92.5% $SnO_2$-7.5 Mole % Mo $SnO_2$-powder and Mo-powder were mixed in the above-noted ratio the Dry Method and hot-pressed as described.

The temperature where densification ceased was 900° C.

The calculated theoretical density of this composition was 6.92 g/cm³ and the measured density of the hot-pressed plate was 6.52 g/cm³.

Electrical conductivity of the target: 0.10 S/cm.

Thin Film Deposition:

Conditions of deposition on glass substrate: The thin films were deposited with a 250 mJ laser pulse at 50 Hz with an oxygen pressure of 10 mTorr and for a period of 33 seconds.

Resistivity/room temperature deposition: $7.96 \times 10^{-1}$ Ω-cm

Transmittance/room temperature deposition: 78.1%

Resistivity/200° C.: $5.89 \times 10^{-1}$ Ω-cm

Transmittance/200° C.: 83.8%

Although the invention has been described in detail in the foregoing for the purpose of illustration, it is to be understood that such detail is solely for that purpose and that variations can be made therein by those skilled in the art without departing from the spirit and scope of the invention except as it may be limited by the claims.

What is claimed is:

1. A composition consisting essentially of: a) from about 60 to about 99 mole % of $SnO_2$ and b) from about 1 to about 40 mole % of a mixture of $MoO_2$ and Mo wherein the mole % is based on the total product and wherein the sum of components a) and b) is 100.

2. The composition of claim 1, consisting essentially of a) from about 90 to about 99 mole % of $SnO_2$ and b) from about 1 to about 10 mole % of the component b).

3. The composition of claim 2, wherein component b) consists of a combination of $MoO_2$ and Mo, with the ratio of moles of $MoO_2$ to moles of moles of Mo is from about 100:1 to about 1:100.

4. The composition of claim 3, wherein the ratio of moles of $MoO_2$ to moles of Mo is from about 10:1 to about 1:10.

5. A sintered product prepared by sintering the composition of claim 1.

6. A sputtering target comprising the product prepared by sintering the composition of claim 1.

7. A transparent electroconductive film prepared by forming on the surface of a substrate, a transparent electroconductive layer of a composition consisting essentially of the composition of claim 1.

8. A sintered product prepared by sintering the composition of claim 2.

9. A sputtering target comprising the product prepared by sintering the composition of claim 2.

* * * * *